United States Patent [19]

Johnson

[11] Patent Number: 5,168,996
[45] Date of Patent: Dec. 8, 1992

[54] PACKAGE

[75] Inventor: William P. Johnson, Gas City, Ind.

[73] Assignee: Pathfinder Services, Inc., Huntington, Ind.

[21] Appl. No.: 700,255

[22] Filed: May 15, 1991

[51] Int. Cl.$^5$ .............................................. B65D 73/02
[52] U.S. Cl. ...................................... 206/334; 206/523
[58] Field of Search ............................. 206/328–334, 206/588–590

[56] References Cited

U.S. PATENT DOCUMENTS

| | | | |
|---|---|---|---|
| 3,322,268 | 5/1967 | Larkin | 206/331 |
| 3,388,465 | 6/1968 | Johnston | 206/329 |
| 4,099,615 | 7/1978 | Lemke et al. | 206/328 |
| 4,193,287 | 3/1980 | Pfeiffer | 206/329 |
| 4,241,829 | 12/1980 | Hardy . | |
| 4,522,303 | 6/1985 | Starr | 206/588 |
| 4,533,976 | 8/1985 | Suwa . | |
| 4,657,137 | 4/1987 | Johnson | 206/332 |
| 4,671,407 | 6/1987 | Brutosky . | |
| 4,724,958 | 2/1988 | Kaneko et al. | 206/334 |
| 4,754,880 | 7/1988 | Tehrani . | |
| 4,767,003 | 8/1988 | Rice et al. . | |
| 4,767,004 | 8/1988 | Ishihara et al. . | |
| 4,790,433 | 12/1988 | Raszewsi | 206/329 |
| 4,842,137 | 6/1989 | Gallagher . | |
| 4,852,737 | 8/1989 | Noll . | |
| 4,977,483 | 12/1990 | Perretta . | |
| 5,007,534 | 4/1991 | Tamaki et al. | 206/329 |

FOREIGN PATENT DOCUMENTS 0254577 10/1989 Japan ................................... 206/589

Primary Examiner—Jimmy G. Foster
Attorney, Agent, or Firm—Lundy & Associates

[57] ABSTRACT

A package comprising a sheet of self-supporting material. The sheet has at least one opening therein. The opening is spaced from the edges of the sheet and is filled with a plug. In specific embodiments, the plug may be of a permeable material to which an item such as an electronic component may be adhered by its pins or may be adhered or the plug may be the item to be shipped itself. In other specific embodiments, the plug and item to be shipped may extend from the sheet in one direction or in both directions. A flexible film layer is overlayed the item and sheet and is secured both to the sheet and to the plug. In a specific embodiment, the sheet is then placed within a carton. The plug either spaces the sheet from the exterior of the carton or overlays the exterior of the carton. The sheet spans the item from the exterior of the carton. The carton may include a plurality of sheets. Each sheet may include a plurality of openings in staggered rows and columns and a plurality of sheets may be stacked with the film layers facing each other with the items spaced from each other and the carton to give maximum protection to the parts shipped.

28 Claims, 2 Drawing Sheets

PACKAGE

BACKGROUND OF THE INVENTION

The subject matter of the invention relates to packaging and a package, and more particularly to a package which is uniquely designed for shipping electronic components, especially those components in which a plurality of pins extend from one side of the component for connection to circuit boards and the like.

A variety of packages have long been proposed. Specialty packages for a variety of articles have heretofore been proposed. With regard to electronic components of the type having pins extending from one side, packages have been proposed heretofore, see for example, U.S. Pat. No. 4,977,483 issued on Dec. 11, 1990 and U.S. Pat. No. 4,767,004 issued on Aug. 30, 1988. Some of these packages, for example, U.S. Pat. No. 4,533,976 includes a package comprising stacked conductive elastic members interleaved between components for providing electrical interconnection between them.

However, each of these packages have problems associated with them. Some are relatively expensive. Some cannot be reused. Some, when opened and a few parts are removed, cease providing a package for the remaining items or assist in inventory monitoring.

Therefore, it is highly desirable to provide an improved package for small, hard to handle, breakable items which will adequately protect those items during shipment.

It is also highly desirable to provide such a package in which each of the items is contained in its own location and can be removed from the package one by one, relatively easily, without disturbing the other items in the package.

It is also highly desirable to provide such a package which will hold a plurality of individual items which can be removed individually so as to assist in inventory control.

It is also highly desirable to provide such a package which is relatively inexpensive to manufacture and use.

It is finally highly desirable to provide such a package with all of the above features.

SUMMARY OF THE INVENTION

It is an object of the invention to provide an improved package for small, hard to handle, breakable items which will adequately protect those items during shipment.

It is another object of the invention to provide such a package in which each of the items is contained in its own location and can be removed from the package one by one, relatively easily, without disturbing the other items in the package.

It is another object of the invention to provide such a package which will hold a plurality of individual items which can be removed individually so as to assist in inventory control.

It is another object of the invention to provide such a package which is relatively inexpensive to manufacture and use.

It is finally an object of the invention to provide such a package with all of the above features.

In the broader aspects of the invention, there is provided a package comprising a sheet of self-supporting material. The sheet has at least one opening therein. The opening is spaced from the edges of the sheet and is filled with a plug. In specific embodiments, the plug may be of a permeable material to which an item such as an electronic component may be adhered by its pins or may be adhered or the plug may be the item to be shipped itself. In other specific embodiments, the plug and item to be shipped may extend from the sheet in one direction or in both directions. A flexible film layer is overlayed the item and sheet and is secured both to the sheet and to the plug. In a specific embodiment, the sheet is then placed within a carton. The plug either spaces the sheet from the exterior of the carton or overlays the exterior of the carton. The sheet spans the item from the exterior of the carton. The carton may include a plurality of sheets. Each sheet may include a plurality of openings in staggered rows and columns and a plurality of sheets may be stacked with the film layers facing each other with the items spaced from each other and the carton to give maximum protection to the parts shipped.

BRIEF DESCRIPTION OF THE DRAWINGS

The above-mentioned and other features and objects of the invention and the manner of attaining them will become more apparent and the invention itself will be better understood by reference to the following description of an embodiment of the invention taken in conjunction with the accompanying drawings wherein.

DESCRIPTION OF A SPECIFIC EMBODIMENT

Figures 1, 2:
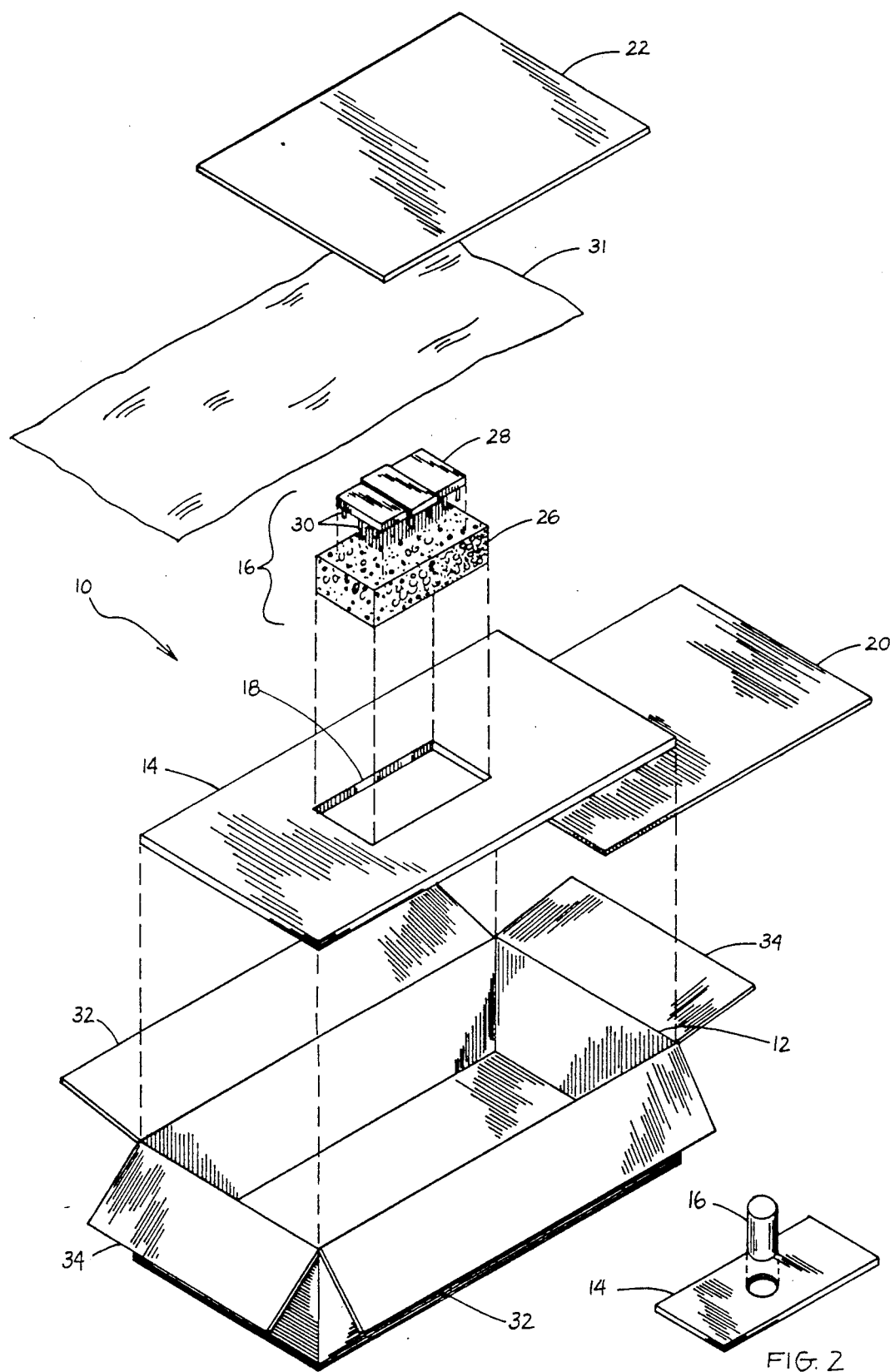
FIG. 1 is an exploded view of the package of the invention.
FIG. 2 shows an alternate embodiment of the sheet of the package of the invention in which the plug is the item to be shipped.

The package 10 of the invention includes a carton 12, at least one sheet 14 and a plug 16. Sheet 14 has an opening 18 therein in which the plug 16 is positioned. Opening 18 and plug 16 are generally of the same size and shape such that plug 16 fits within opening 18 without damage to plug 16, frictionally, so that plug 16 will not be dislodged unintentionally from sheet 14 during shipping. In the embodiment illustrated in FIG. 1, alternative sheets 20 and 22 may be placed adjacent the top and the bottom of carton 12 with the sheet 18 and the plug 16 therebetween. In other embodiments, either sheet 20 or 22 may be eliminated from the package 10 of the invention.

Figure 4:
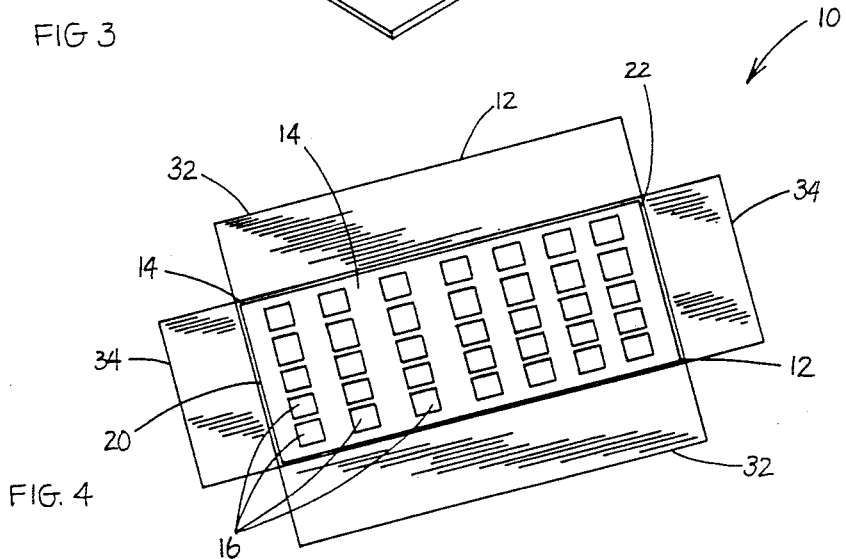
FIG. 4 shows the package of the invention fully packed with a pair of sheets such as illustrated in FIG. 3. The carton is shown with the top open ready for placing a sheet over the top and the closing and shipping the carton.

Carton 12 may be one of any number of conventional cartons. In a specific embodiment, carton 12 is made of 200 pound burst corrugated cardboard. In a specific embodiment, sheets 20 and 22 have the same dimensions and shape as the inside top and bottom of carton 12 and are also made of 200 pound burst corrugated cardboard. In specific embodiments, the carton 12 can be of any shape whatsoever with the sheets 14, 20 and 22 each being complementary with the inside dimensions and shape of the carton. Furthermore, the sheets 20 and 22 can be laid horizontally as illustrated in FIG. 1, or on edge as illustrated in FIG. 4, as desired.

Sheet 14 has at least one opening 18 therein. Opening 18 is sized and shaped to cooperate with the plug 16. Plug 16 can either be square, rectangular, as shown in FIG. 1, circular as shown in FIG. 2, or other geometric shapes in cross-section.

Plug 16 may either be the item which is to be shipped as shown in FIG. 2, or a base 26 to which the item 28 is to be adhered or otherwise secured as shown in FIG. 1. If the item 28 to be shipped is to be secured to the base 26 by pins 30, such as with most electronic components which are designed to be mounted on circuit boards, base 26 takes the form of a plug of a permeable material adapted to receive pins 30 having a cross-sectional shape complementary to the size and shape of the opening 18 and a thickness greater than sheet 14. In other embodiments not shown, base 26 may have a cavity therein in which item 28 is positioned. In still other embodiments, item 28 may be adhesively secured to base 26.

In all embodiments of the invention, base 26 and item 28 are combined to form plug 16. Base 26, in a specific embodiment, is larger than item 28. Thus, when item 28 is assembled on base 26 and base 26 is assembled within opening 18 of sheet 14, base 26 extends from sheet 14 either on one side thereof or on both sides thereof and plug 16 extends from sheet 14 either on one side thereof or both sides thereof and item 28 is spaced from the periphery of base 26. If item 28 is of the type which has pins 30 extending from both sides of item 28, then an additional base 26 is provided and secured to item 28 by the pins 30 and the item 28 is sandwiched between two bases 26. In this embodiment, only a single base 26 is positioned in the opening 18 or the two bases 26 with the item 28 therebetween is positioned in opening 18 and in cross-section is complementary to the size and shape of opening 18. In this latter embodiment, the two bases 26 and the item 28 are considered plug 16.

In a specific embodiment, base 26 can be made of 2 pound density, Styrofoam, rubber-backed Stryrofoam, or beaded dialite polystyrene material.

When sheet 14 and plug 16 as illustrated in FIG. 1 or when sheet 14 and plug 16 as illustrated in FIG. 2 are utilized, the entire sheet 14 and plug 16 are covered by a sheet 31 of film material which is adhered to both the plug 16 and the sheet 14. This film material, in a specific embodiment, may be 5 mil, 7 mil or 10 mil Dacron polyester sheet, or 5 mil, 7 mil or 10 mil Plaskin polyester sheet laid over both plug 16 and sheet 14 and secured to both plug 16 and sheet 14. In the embodiment illustrated in FIG. 1 in which the plug 16 is a combination of the item 28 and the base 26, may be adhesively secured to the exposed parts of the item 28, the base 26 and the sheet 14. The adherence of sheet 31 to the item 28, the base 26, or the sheet 14 may be by utilizing a skin-wrap material, a film heat seal technique, or any other adhesive or adhesive means which will allow for the item 28 to be easily stripped from the skin-wrapped material and the sheet 31 easily removed from the plug 16 and the sheet 14 when desired.

In the embodiment of the package 10 illustrated in FIGS. 1 and 2, the plug 16 may extend from both sides of sheet 14 such that plug 16 spaces the sheet 14 between the top and bottom or opposite ends of the carton 12. In this particular instance, sufficient number of sheets 20 and 22 are utilized so as to protect the opposite ends of plug 16 from damage to the exterior of carton 12 during shipping. On the other hand, sheet 14 may rest on the bottom of carton 12, plug 16 extending upwardly with only a single sheet 22 overlaying the plug 16 prior to closing the carton 12. These variations are determined by the specific article to be shipped, the size of the carton and shipping requirements.

Figure 3:
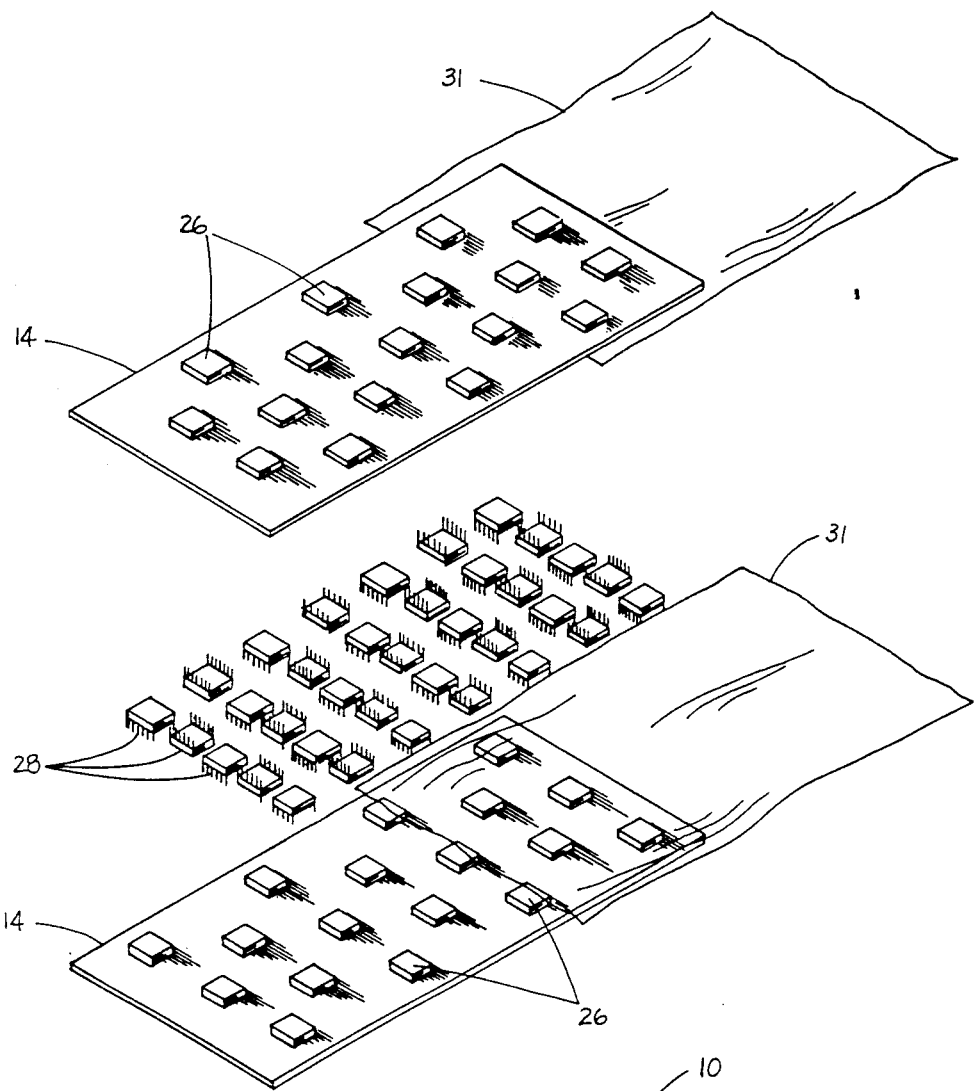
FIG. 3 illustrates two of the sheets of the package of the invention with plugs and items exploded therefrom. Each of the sheets has staggered rows and columns of openings therein.

In other embodiments, sheets 14 are provided with a plurality of openings 18 arranged in rows and columns and spaced apart. Sheet 14, when viewed from one side and/or the other, appear to be mirror images of each other. Thus, two identical sheets can be arranged as shown in FIG. 3 to provide for openings 18 in rows and columns which are staggered with respect to each other, and a plurality of plugs 16 can placed within the plurality of openings 18 of each of the sheets 14 as shown in FIG. 3 and the two sheets brought together as shown in FIG. 4 thereby defining a "sandwich" with the two exterior surfaces being of the sheet 14 with a plurality of rows and columns of plugs 16 held in spaced apart relationship by the sheets 14 therebetween. As with the other embodiments illustrated in FIGS. 1 and 2, each of the sheets 14 in FIG. 3 are overlayed with a sheet 31 adhesively secured to both plug 16 and sheets 14. The two sheets 14 are then placed together with their respective sheets 31 contiguous for shipping.

In specific embodiments, sheets 14 have been provided in a plurality of sizes having any number of openings 18 as desired.

Referring now to FIG. 4, there is shown a fully assembled package 10 of the invention. Carton 12 is a conventional carton in which both the bottom and the top consist of four flaps, two side flaps 32 and two end flaps 34, which when closed form the bottom and the top of carton 12. Within the carton 12 are positioned sheets 20 and 22 and a plurality of sheets 14, each having a plurality of staggered rows and columns of openings 18 therein with plug 16 within the openings 18. By this construction, each of the plugs 16 are either spaced from the sides of the carton 12 or have between the plugs 16 and the ends of the carton two sheets 14, 14 or 14, 20 or 14, 22 to protect them from damage. In the embodiment illustrated in FIG. 3, both ends have sheets 14, 20 and sheets 14, 22 in addition to the ends of carton 12. In still other embodiments, each sheets 20 and 22 can be positioned both under the sheets 14 having plugs 16 mounted thereon in accordance with the invention and over the plugs 16 mounted to the sheets 14 in accordance with the invention before the carton 12 is closed.

In accordance with the invention, an improved package for delicate parts has been provided. The package is useful to ship small, hard to handle, breakable parts. The package is usable with electronic components having pin connectors and for a variety of other parts. The package has the advantage that parts may be taken from the package one by one, leaving the remaining parts in tact such that the remaining parts are still protected by the package and inventory control is made easier, and reshipping is made possible.

While a specific embodiment of the invention has been shown and described herein for purposes of illustration, the protection afforded by any patent which may issue upon this application is not strictly limited to the disclosed embodiment; but rather extends to all structures and arrangements which fall fairly within the scope of the claims which are appended hereto:

What is claimed is:

1. A package comprising a sheet of self-supporting material adapted to be placed in a container having interior dimensions about equal to the length and width of said sheet, said sheet having opposite edges and at least one opening therein, said at least one opening being spaced from said sheet edges, a plug which carries the item to be shipped, said plug removably held in said opening, said plug extending from said opening in at least one direction, and a flexible film overlaying said plug and being adhesively secured to said sheet and plug.

2. The package of claim 1 wherein said plug and opening are about complementary in cross-sectional shape and size.

3. The package of claim 1 wherein said plug is of permeable material, said permeable material being adapted to receive outwardly extending portions of said item to be shipped, said item being positioned on said plug and connected thereto by said portions.

4. The package of claim 3 wherein said flexible film is also adhesively secured to said item.

5. The package of claim 1 wherein said item has at least one outwardly extending protrusion, said item being positioned on said plug with said at least one protrusion within said plug, said plug having a thickness greater than the length of said protrusion.

6. The package of claim 1 further comprising additional sheets of self-supporting material adapted to be placed in a container having interior dimensions about equal to the length and width of said sheet, each of said additional sheets having opposite edges and at least one opening therein, said sheet and said additional sheets being placed in a container side by side, said container having interior dimensions about equal to the length and width of said sheets, said sheets being spaced from each other by said plugs.

7. The package of claim 6 wherein said at least one of said openings being a plurality of spaced apart openings arranged in rows and columns.

8. The package of claim 7 wherein said openings of adjacent rows and columns are staggered.

9. The package of claim 8 wherein said staggered plurality of openings are spaced sufficiently apart to allow the plugs of the first of said sheets to be positioned between the plugs of the second of said sheets in a spaced apart relation with said first and second sheets being spaced apart by said plugs.

10. The package of claim 9 wherein said plug is the item for which the package is provided.

11. The package of claim 9 wherein said plugs include a base and said item positioned on and secured to said base.

12. The package of claim 11 wherein said film is secured to said item.

13. The package of claim 9 wherein said openings are chosen from the group of shapes consisting of round, square and rectangular shapes.

14. The package of claim 6 wherein said openings are chosen from the groups of shapes consisting of round, square and rectangular shapes.

15. The package of claim 6 wherein said plug is a base positioned within said opening and said item positioned on and connected to said base.

16. The package of claim 6 wherein said plug is said item.

17. The package of claim 1 wherein said plug is said item.

18. The package of claim 1 wherein said plug is a base positioned within said opening and said item positioned on and connected to said base.

19. The package of claim 18 wherein said film is secured to said item.

20. The package of claim 1 wherein said opening is chosen from the groups of shapes consisting of round, square and rectangular shapes.

21. The package of claim 1 wherein said plug extends from said opening in both directions.

22. The package of claim 1 wherein said sheet openings are arranged in rows and columns.

23. A package comprising a sheet of self-supporting material, said sheet having opposite edges and at least one opening therein, said at least one opening being spaced from said sheet edges and being filled with a plug, and a flexible film overlaying said plug and being adhesively secured to said sheet, said sheet being placed in a container, said container having interior dimensions about equal to the length and width of said sheet, an item having at least one outwardly extending protrusion, said item being positioned on said plug, said plug being of permeable material, said permeable material receiving said outwardly extending protrusions of said item within said plug, said plug having a thickness greater than the length of said protrusion.

24. The package of claim 1 wherein said plug fills said opening.

25. The package of claim 23 wherein said plug and opening are complementary in cross-sectional shape and size.

26. The package of claim 23 wherein said plug is of permeable material, said permeable material being adapted to receive outwardly extending portions of said item to be shipped, said item being positioned on said plug and connected thereto by said portions.

27. The package of claim 23 wherein said item has at least one outwardly extending protrusion, said item being positioned on said plug with said at least one protrusion within said plug, said plug having a thickness greater than the length of said protrusion.

28. A package comprising a sheet of self-supporting material, said sheet having opposite edges and at least one opening therein, said at least one opening being spaced from said sheet edges and being filled with a plug which includes the item to be shipped, and a flexible film layer overlaying the plug and being adhesively secured to said sheet and plug, said plug extending from said opening in at least one direction.

* * * * *